United States Patent
Lea et al.

(10) Patent No.: US 12,406,718 B2
(45) Date of Patent: *Sep. 2, 2025

(54) PROCESSING IN MEMORY

(71) Applicant: Lodestar Licensing Group LLC, Evanston, IL (US)

(72) Inventors: Perry V. Lea, Eagle, ID (US); Timothy P. Finkbeiner, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/430,136

(22) Filed: Feb. 1, 2024

(65) Prior Publication Data

US 2024/0170047 A1    May 23, 2024

Related U.S. Application Data

(60) Continuation of application No. 17/694,184, filed on Mar. 14, 2022, now Pat. No. 11,894,045, which is a
(Continued)

(51) Int. Cl.
*G11C 11/408* (2006.01)
*G06F 3/06* (2006.01)
(Continued)

(52) U.S. Cl.
CPC .......... *G11C 11/4085* (2013.01); *G06F 3/061* (2013.01); *G06F 3/0659* (2013.01);
(Continued)

(58) Field of Classification Search
CPC .............. G11C 11/4085; G11C 7/1006; G11C 11/4076; G11C 11/408; G11C 11/4091;
(Continued)

(56) References Cited

U.S. PATENT DOCUMENTS

| | | |
|---|---|---|
| 4,380,046 A | 4/1983 | Fung |
| 4,435,792 A | 3/1984 | Bechtolsheim |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Jerome Leboeuf

(57) ABSTRACT

An example apparatus includes a processing in memory (PIM) capable device having an array of memory cells and sensing circuitry coupled to the array. The PIM capable includes a row address strobe (RAS) component selectably coupled to the array. The RAS component is configured to select, retrieve a data value from, and input a data value to a specific row in the array. The PIM capable device also includes a RAS manager selectably coupled to the RAS component. The RAS manager is configured to coordinate timing of a sequence of compute sub-operations performed using the RAS component. The apparatus also includes a source external to the PIM capable device. The RAS manager is configured to receive instructions from the source to control timing of performance of a compute operation using the sensing circuitry.

20 Claims, 5 Drawing Sheets

Related U.S. Application Data continuation of application No. 16/989,620, filed on Aug. 10, 2020, now Pat. No. 11,276,457, which is a division of application No. 15/693,366, filed on Aug. 31, 2017, now Pat. No. 10,741,239.

(51) Int. Cl.
  *G11C 7/10* (2006.01)
  *G11C 11/4076* (2006.01)
  *G11C 11/4091* (2006.01)
  *G11C 11/4096* (2006.01)

(52) U.S. Cl.
  CPC .......... *G06F 3/0673* (2013.01); *G11C 7/1006* (2013.01); *G11C 11/4076* (2013.01); *G11C 11/408* (2013.01); *G11C 11/4091* (2013.01); *G06F 3/0625* (2013.01); *G11C 11/4096* (2013.01)

(58) Field of Classification Search
  CPC . G11C 11/4096; G11C 11/4063; G06F 3/061; G06F 3/0659; G06F 3/0673; G06F 3/0625
  See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,747,047 A | 5/1988 | Coogan et al. |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,329,630 A | 7/1994 | Baldwin |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,185,664 B1 | 2/2001 | Jeddeloh |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,184,346 B1 | 2/2007 | Raszka et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |

(56) References Cited

U.S. PATENT DOCUMENTS

| | | |
|---|---|---|
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,058,135 B1 | 6/2015 | Schumacher et al. |
| 9,165,023 B2 | 10/2015 | Moskovich et al. |
| 9,274,712 B2 | 3/2016 | Feldman et al. |
| 10,120,740 B2 | 11/2018 | Lea et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0122332 A1 | 9/2002 | Kim |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0283546 A1 | 12/2005 | Huppenthal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0180450 A1 | 7/2008 | Dowling |
| 2008/0215937 A1 | 9/2008 | Dreibelbis et al. |
| 2009/0067218 A1 | 3/2009 | Graber |
| 2009/0070721 A1 | 3/2009 | Solomon |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0095088 A1 | 4/2010 | Vorbach |
| 2010/0110745 A1 | 5/2010 | Jeddeloh et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0318764 A1 | 12/2010 | Greyzck |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0093665 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0113732 A1 | 5/2012 | Sohn et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0181380 A1 | 6/2014 | Feldman et al. |
| 2014/0181417 A1 | 6/2014 | Loh et al. |
| 2014/0185395 A1 | 7/2014 | Seo |
| 2014/0215185 A1 | 7/2014 | Danielsen |
| 2014/0244948 A1 | 8/2014 | Walker et al. |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0100744 A1 | 4/2015 | Mirichigni et al. |
| 2015/0120987 A1 | 4/2015 | Wheeler |
| 2015/0134713 A1 | 5/2015 | Wheeler |

(56) References Cited

U.S. PATENT DOCUMENTS

| | | |
|---|---|---|
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357011 A1 | 12/2015 | Schaefer et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098200 A1 | 4/2016 | Guz et al. |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0246514 A1 | 8/2016 | Nosaka et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0342339 A1 | 11/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |
| 2017/0083434 A1 | 3/2017 | Potash |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0293427 A1 | 10/2017 | Kwon et al. |
| 2018/0053545 A1 | 2/2018 | Son |
| 2018/0246814 A1 | 8/2018 | Jayasena et al. |
| 2019/0018597 A1 | 1/2019 | Zhang et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Office Action from related China Patent Application No. 201811004176.9, dated Mar. 15, 2022, 16 pages.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, mailed Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

| | 444 | 445 | 456 | 470 | 471 |
|---|---|---|---|---|---|
| | A | B | NOT OPEN | OPEN TRUE | OPEN INVERT |
| | 0 | 0 | 0 | 0 | 1 |
| | 0 | 1 | 0 | 1 | 0 |
| 475 → | 1 | 0 | 1 | 0 | 1 |
| | 1 | 1 | 1 | 1 | 0 |

4-2

| | | | | | | | | | | | |
|---|---|---|---|---|---|---|---|---|---|---|---|
| | FF | 0 | 0 | 0 | 0 | 0 | 0 | 1 | 1 | 1 | ← 476 |
| | FT | 0 | 0 | 0 | 1 | 1 | 1 | 0 | 0 | 0 | ← 477 |
| | TF | 0 | 0 | 1 | 0 | 0 | 1 | 0 | 0 | 1 | ← 478 |
| | TT | 0 | 1 | 0 | 0 | 1 | 0 | 0 | 1 | 0 | ← 479 |
| A | B | A | A*B | A*B̄ | A+B | B | AXB | A+B̄ | ĀXB̄ | B̄ | ← 447 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

(476–479 grouped as 480)

PROCESSING IN MEMORY

PRIORITY INFORMATION

This application is a Continuation of U.S. application Ser. No. 17/694,184, filed Mar. 14, 2022, which issues as U.S. Pat. No. 11,894,045 on Feb. 6, 2024, which is a Continuation of U.S. application Ser. No. 16/989,620, filed Aug. 10, 2020, which issued as U.S. Pat. No. 11,276,547 on Mar. 15, 2022, which is a Divisional of U.S. application Ser. No. 15/693,366, filed Aug. 31, 2017, which issued as U.S. Pat. No. 10,741,239 on Aug. 11, 2020, the contents of which are included herein by reference.

TECHNICAL FIELD

The present disclosure relates generally to semiconductor memory and methods, and more particularly, to apparatuses and methods for processing in memory.

BACKGROUND

Memory devices are typically provided as internal, semiconductor, integrated circuits in computers or other computing systems. There are many different types of memory including volatile and non-volatile memory. Volatile memory can require power to maintain its data, e.g., host data, error data, etc., and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources, e.g., one or more processors, which may retrieve and execute instructions and store the results of the executed instructions to a suitable location. A processing resource, e.g., CPU, can include a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert, e.g., inversion, logical operations on data, e.g., one or more operands. For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for example, by a processing resource such as a controller and/or host processor. Data, e.g., the operands on which the instructions will be executed, may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption of a computing device and/or system.

In many instances, the processing resources, e.g., processor and/or associated functional unit circuitry, may be external to the memory array, and data is accessed via a bus between the processing resources and the memory array to execute a set of instructions. Processing performance may be improved in a processor-in-memory device, in which a processor may be implemented internal and/or near to a memory, e.g., directly on a same chip as the memory array. A processor-in-memory device may save time by reducing and/or eliminating external communications and may also conserve power.

BRIEF DESCRIPTION OF THE DRAWINGS

FIG. 4 is a logic table illustrating selectable logic operation results implemented by sensing circuitry shown in FIG. 3 in accordance with a number of embodiments of the present disclosure.

DETAILED DESCRIPTION

Figure 1A:
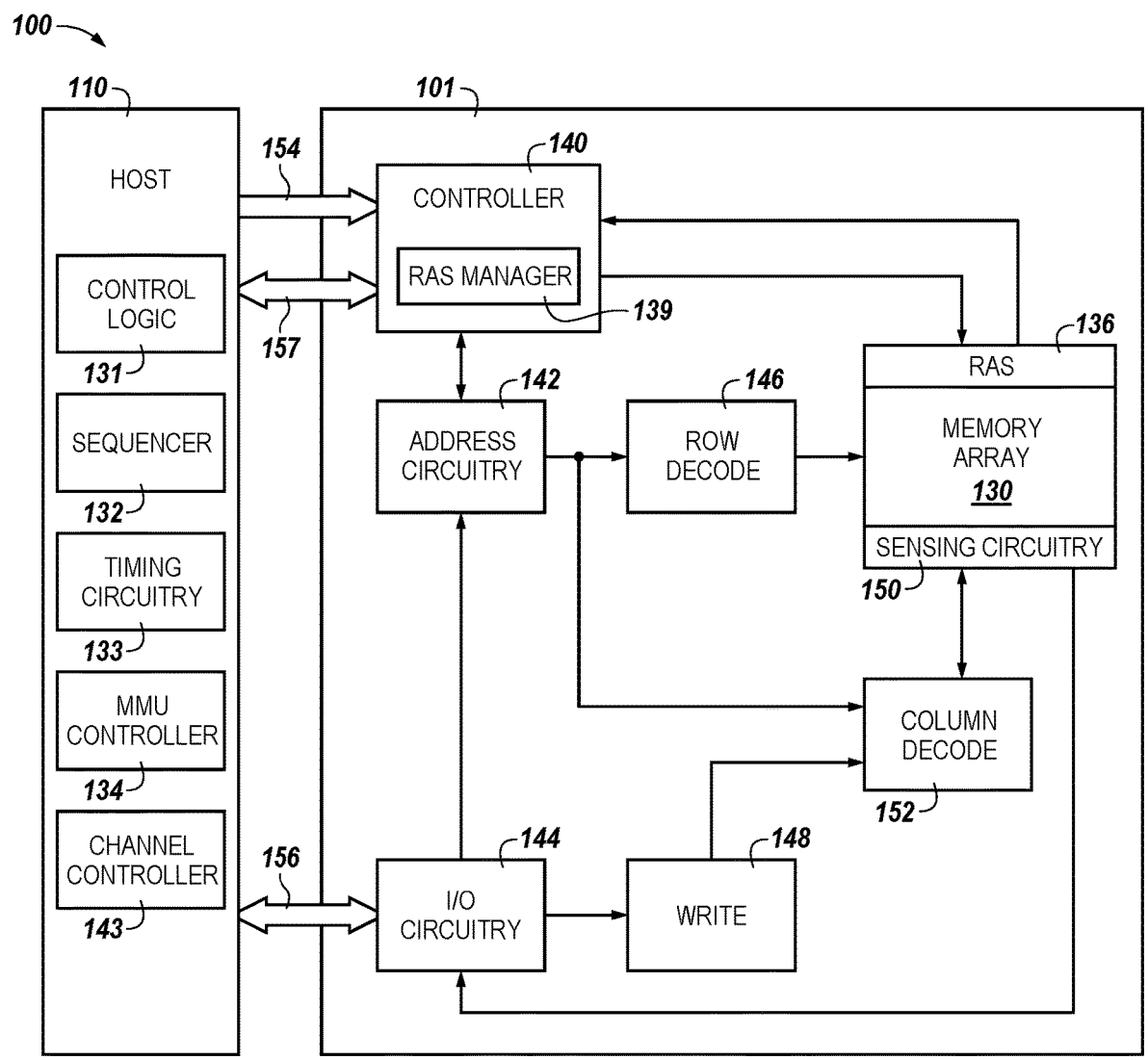
FIG. 1A is a block diagram of an apparatus in the form of a computing system including one example of a memory device coupled to a host.

The present disclosure includes apparatuses and methods to use a processing in memory (PIM) capable device to perform in-memory operations. An example of an apparatus including a PIM capable device, e.g., as shown and described in connection with FIG. 1A, includes an array of memory cells and sensing circuitry coupled to the array, where the sensing circuitry includes a sense amplifier and a compute component. The PIM capable device includes a row address strobe (RAS) component selectably coupled to the array. The RAS component is configured to select a specific row of memory cells in the array, retrieve a data value from the specific row, and/or input a data value to the specific row. The PIM capable device also includes a RAS manager selectably coupled to the RAS component. The RAS manager is configured to coordinate timing of a sequence of compute sub-operations associated with a bit vector operation performed using the RAS component. The apparatus also includes a source external to the PIM capable device. The RAS manager is configured to receive instructions from the source to control timing of performance of a compute operation, associated with a bit vector operation, using the sensing circuitry.

In some embodiments, the PIM capable device, e.g., bit vector operation circuitry, may include the RAS manager and the RAS component. The PIM capable device may be configured to control timing, e.g., by the RAS manager and/or the RAS component, of performance sub-operations by the array based upon logical operation commands that enable performance of memory operations, e.g., bit vector operations and/or logical operations as described herein.

As used herein, a PIM capable device 101 may refer to a memory device capable of performing logical operations on data stored in an array of memory cells using a processing resource internal to the memory device, e.g., without transferring the data to an external processing resource such as a host processor. As an example, a PIM capable device 101 can include a memory array coupled to sensing circuitry comprising sensing components operable as 1-bit processing elements, e.g., to perform parallel processing on a per column basis. A PIM capable device 101 also may perform memory operations in addition to logical operations performed "in memory," which can be referred to as "bit vector operations." As an example, PIM capable device 101 may include a dynamic random access memory (DRAM) array with memory operations including memory access operations such as reads, e.g., loads, and/or writes, e.g., stores, among other operations, e.g., erase, that do not involve operating on the data, e.g., by performing a Boolean operation on the data. For example, a PIM capable device 101 can operate a DRAM array as a "normal" DRAM array and/or as a PIM DRAM array depending on a type of program being executed, e.g., by a host 110, which may include both memory operations and bit vector operations. For example, bit vector operations can include logical operations such as Boolean operations, e.g., AND, OR, XOR, etc., and transfer operations such as shifting data values in the array and inverting data values, among other examples.

As used herein, a PIM operation can refer to various operations associated with performing in memory processing utilizing a PIM capable device. An operation hierarchy can be used to define levels of PIM operations. For example, a first, e.g., lower, level in the operation hierarchy may include performance of low level bit vector operations, e.g., fundamental and/or individual logical operations, which may be referred to as "primitive" operations. A next, e.g., middle, level in the operation hierarchy may include performance of composite operations, which comprise receipt of instructions for performance of multiple bit vector operations. For instance, composite operations can include mathematical operations such as adds, multiplies, etc., which can comprise a number of logical ANDs, ORs, XORs, shifts, etc. A third, e.g., higher, level in the operation hierarchy can include control flow operations, e.g., looping, branching, etc., associated with executing a program determined by the host 110 and with associated commands sent to the PIM capable device 101, where execution of these commands involves performance of downstream logical operations by the PIM capable device, including bit vector operations. As such, the third level in the operation hierarchy may be termed "automated control" by the PIM capable device 101 based on capability of performance of the logical operations on the PIM capable device 101 following input of the control flow operation commands by the host 110.

As described in more detail herein, PIM operations may be executed by various components within a system comprising a PIM capable device. For example, the present disclosure describes a first level in the operation hierarchy in which control logic 131, which may be referred to as a "scalar unit" and which can be located on a host 110, may execute control flow operations and/or may provide composite operations to a sequencer 132, which also may be located on the host. The composite operations may include a number of operations in which a sequence of operations is to be performed (e.g., add, multiply, shift, logical operations, etc.). In some embodiments, the composite operation commands may provide an entry point into a sequence of VLIW instructions to cause perform such composite operations. In a number of embodiments, the sequencer 132 may provide sequencing instructions to timing circuitry 133 that controls timing of performance of logical operations, which also may be located on the host. The timing circuitry 133 may provide timing instructions for performance of the low level bit vector operations from the host 110 to a controller 140 located on the PIM capable device, e.g., provided to the RAS manager 139 associated with the controller 140, which can then direct performance of the low level bit vector operations, e.g., by a RAS component 136 associated with a memory array 130 and/or sensing circuitry 150 coupled to the memory array 130. The RAS manager 139 associated with the controller 140 also may enable and/or direct a return of results of performance of the low level bit vector operations to the host 110.

In contrast to the third level of the hierarchy, in which the sequencer 132, the timing circuitry 133, RAS manager 139, and the RAS component 136 may be located on the PIM capable device 101, the first level described herein may, among these components, have only the RAS manager 139 and the RAS component 136 located on the PIM capable device 101. As such, the first level in the operation hierarchy may be termed "directed control" by the PIM capable device 101 based on capability of performance of low level bit vector operations by the RAS manager 139 and the RAS component 136 on the PIM capable device 101 following performance preceding operations by the control logic 131, the sequencer 132, and the timing circuitry 133 on the host 110.

As described further herein, an interface, e.g., bus, used to transfer instructions, e.g., commands, for performance of PIM operations and/or transfer of results thereof between the PIM capable device 101 and the host 110 may include a sideband channel 157. The sideband channel 157 can be a bus separate from a memory interface, such as a DDR interface, used to transfer commands, addresses, and/or data, e.g., for DRAM read and/or write operations.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more", e.g., a number of memory arrays, can refer to one or more memory arrays, whereas a "plurality of" is intended to refer to more than one of such things. Furthermore, the words "can" and "may" are used throughout this application in a permissive sense, i.e., having the potential to, being able to, not in a mandatory sense, i.e., must. The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context. The terms "separate from" and "external to" are also used interchangeably herein, e.g., to indicate components not being physically and/or functionally integrated as one being a subcomponent of the other, and can have the same meaning, as appropriate to the context. The term "associated with" may mean physically associated with, included as part of, or being a subcomponent of the other, as appropriate to the context.

The figures herein follow a numbering convention in which the first digit or digits correspond to the figure number and the remaining digits identify an element or component in the drawing. Similar elements or components between different figures may be identified by the use of similar digits. For example, 205 may reference element "05" in FIG. 2, and a similar element may be referenced as 305 in FIG. 3. Multiple analogous elements within one figure may be referenced with a reference numeral followed by a hyphen and another number or a letter. For example, 205-1 may reference element 05-1 in FIGS. 2 and 205-2 may reference element 05-2, which can be analogous to element 05-1. Such analogous elements may be generally referenced without the hyphen and an extra numeral or letter. For example, elements 205-1 and 205-2 may be generally referenced as 205.

Elements shown in the various embodiments herein can be added, exchanged, and/or eliminated so as to provide a number of additional embodiments of the present disclosure. In addition, the proportion and the relative scale of the elements provided in the figures are intended to illustrate certain embodiments of the present invention, and should not be taken in a limiting sense.

FIG. 1A is a block diagram of an apparatus in the form of a computing system 100 including one example of a PIM capable device 101 selectably coupled to a host 110. As used herein, a PIM capable device 101, controller 140, sideband channel 157, memory array 130, sensing circuitry 150, control logic 131, sequencer 132, timing circuitry 133, RAS manager 139, RAS component 136, channel controller 143, e.g., as shown and described in connection with FIG. 1A, and/or bank arbiter 145, e.g., as shown and described in connection with FIG. 1B, might also be separately considered an "apparatus."

The PIM capable device 101 (also referred to as a "memory device 101") may include a controller 140. Operations performed by the PIM capable device 101 can use bit vector based operations, e.g., PIM operations performed as logical operations, as described herein, in addition to DRAM operations, e.g., read, write, copy, and/or erase operations, etc. As used herein, the term "bit vector" is intended to mean a physically contiguous number of bits on a memory device, e.g., PIM capable device, whether physically contiguous in rows, e.g., horizontally oriented, or columns, e.g., vertically oriented, in an array of memory cells. Thus, as used herein, a "bit vector operation" is intended to mean an operation that is performed in-memory, e.g., as a PIM operation, on a bit vector that is a contiguous portion (also referred to as "chunk") of virtual address space. For example, a chunk of virtual address space may have a bit length of 256 bits. A chunk may or may not be contiguous physically to other chunks in the virtual address space. As such, bit vector operations may include logical operations, e.g., Boolean operations, and additional operations, such as data shifts, addition, subtraction, multiplication, and/or division, etc.

The controller 140 may be associated with, or may include, a RAS manager 139 configured to coordinate timing of a sequence of compute sub-operations, associated with a bit vector operation, performed using a RAS component 136. The RAS manager 139 may be physically associated with the controller 140 on the memory device 101. The RAS component 136 may be selectably coupled to an array 130 of memory cells. The RAS component 136 may be configured to select a specific row of memory cells in the array 130, retrieve a data value from a specific row, and/or input a data value to a specific row.

The array 130 of memory cells shown in FIG. 1A may represent a plurality of arrays, and/or a plurality of subarrays in each array, of memory cells in the memory device 101. The array 130 may, in some embodiments, be a DRAM array. However, embodiments of the array 130 are not limited to a DRAM configuration.

The specific row from which the data value is input via the RAS component 136 may, in some embodiments, be the same row or a different row in the array 130 from which the data value was retrieved by the RAS component 136. For example, in some embodiments, a data value may be retrieved via the RAS component 136 from a particular memory cell at a particular position in a specific row, a compute operation may be performed on the retrieved data value while being stored, at least temporarily, by the sensing circuitry 150, and a data value that is a result of performance of the compute operation may be moved, e.g., returned, via RAS component 136 to the same memory cell at the same location in the same row. Embodiments, however, are not limited to these sub-operations.

The RAS component 136 may, in various embodiments, be configured to perform sub-operations of a compute operation, associated with the bit vector operation, as a result of the compute operation directed by the RAS manager 139. For example, the RAS component 136 may be directed by the RAS manager 139 to perform a sequence of the sub-operations that enable the compute operations to be performed. Such sub-operations may include shifting a number of data values in various rows a particular number of bits, moving, e.g., retrieving and/or inputting, a number of data values from particular memory cells and/or rows in the array 130 to the sensing circuitry 150, e.g., for storage by the sense amplifiers 206 and/or compute components 231, and/or tracking a number of sub-operations performed to achieve performance of the compute operation, among other sub-operations contributing to granularity of the compute operation. For example, as described herein, a compute operation may, in various embodiments, be a shift operation and/or logical AND, OR, and/or XOR Boolean operations, among various other operations, performed using the sensing circuitry 150.

The compute operation may be performed in the sensing circuitry 150 by a sense amplifier, e.g., as shown at 206 and 306 and described in connection with FIGS. 2 and 3, respectively, and/or a compute component, e.g., as shown at 231 and 331 and described in connection with FIGS. 2 and 3, respectively. The compute operation may include, in various embodiments, to store, e.g., cache, the data value by the sense amplifier or the compute component included in the sensing circuitry, perform the compute operation on the stored data value, and store a result of the compute operation in the array 130.

FIG. 1A is provided as an example of a system 100 including a PIM capable device 101 architecture and/or functionality, e.g., as shown and described in connection with FIGS. 2-4. The PIM capable device 101 is further configured to receive, by the RAS manager 139, instructions to control timing of performance of a compute operation using the sensing circuitry 150. In some embodiments, the instructions may be received from timing circuitry 133 located at a source separate from the memory device 101, e.g., timing circuitry at or physically associated with the host 110 located external to the memory device 101. The timing circuitry 133 may be selectably coupled to the RAS manager 139 on the memory device 101 to issue the instructions to control the timing of performance of the compute operation, associated with the bit vector operation, using the sensing circuitry 150. In some embodiments, the timing circuitry 133 and the RAS manager 139 may be in different clock domains and operate at different clock speeds.

Logical operation commands received by the RAS manager 130 may include commands that are different from double data rate (DDR) commands for read and write DRAM operations. The RAS component 136 that may be used to perform the sequence of compute sub-operations may be separate from decoder circuitry, e.g., row decoder 146 and a column decoder 152 shown at and described in connection with FIG. 1A, used to perform the read and write DRAM operations. In a number of embodiments, the RAS component 136 may be configured to move a data value to and from the sensing circuitry 150 coupled to the array 130 for performance of the compute sub-operations thereon and to move a result data value to a controller 140 associated with the RAS manager 139, e.g., to enable transfer of the result data value to the source, e.g., host 110, via a sideband channel 157. The RAS manager 139 may be selectably coupled to a sidebar channel 157 to receive commands, from the source, to coordinate the timing of the sequence of compute sub-operations by the RAS component 136. In contrast, input/output (I/O) circuitry, e.g., as shown at 144 and described in connection with FIG. 1A, may be selectably coupled to a data/address bus, e.g., as shown at 156 and described in connection with FIG. 1A, to receive commands, from the source, for read and write DRAM operations performed by decoder circuitry. As such, the RAS component 136 may be separate from the decoder circuitry.

Execution of the instructions to control the timing of performance of the compute operation may provide conflict free usage of a shared resource, e.g., the sense amplifiers 206 and/or compute components 231, during performance of read and/or write DRAM operations and performance of the compute operations, e.g., logical operations. For example, application of the timing instructions may reduce or prevent substantially simultaneous usage of the sense amplifiers 206 of the sensing circuitry 150 by reducing or preventing substantially simultaneous performance of a DRAM operation and a compute operation or two compute operations, among other possibilities, which would otherwise both use at least one of the sense amplifiers 206, e.g., and also, in some embodiments, at least one of the compute components 231. As such, the timing circuitry 133 may provide timing to coordinate performance of the DRAM operations and/or the compute operations and be responsible for providing conflict free access to the arrays, such as array 130 in FIG. 1A. The timing circuitry 133 in the host 110 may, in some embodiments, be or may include a state machine to control the timing of performance of logical operations using the sensing circuitry of the array.

Each of the intended operations may be fed into a first in/first out (FIFO) buffer provided by the timing circuitry 133 for enabling timing coordination with the sensing circuitry 150 associated with the array 130 of memory cells. In various embodiments, the timing circuitry 133 provides timing and is responsible for providing conflict free access to the arrays from a number of FIFO queues. As such, the timing circuitry 133 can be configured to control timing of operations for the sensing circuitry 150. For example, one FIFO queue may support receipt, e.g., input, via control logic 131, by a sequencer 132 and/or the timing circuitry 133 of the host 110 and processing of compute operations, whereas one FIFO queue may be for input and output (I/O) of DRAM operations, among other possible configurations.

The RAS manager 139 may, in some embodiments, be separate from, for example, double data rate (DDR) registers (not shown) used to control read and write DRAM access requests for the array 130. For example, the DDR registers may be accessed by the host 110 via a data/address bus 156, e.g., an I/O bus used as a DDR channel, through I/O circuitry 144 using DDR signaling.

In contrast, a sideband channel 157 may, in various embodiments, be configured to receive, e.g., transmit, commands and/or data from a separate source, e.g., the timing circuitry 133 associated with the host 110, to control performance of a number of compute operations. Alternatively or in addition, the sideband channel 157 may receive, e.g., transmit, commands and/or data from a channel controller 143. The sideband channel 157 may, in various embodiments, be a bidirectional single channel for direct communication with the PIM capable device 101, e.g., between the timing circuitry 133 and the RAS manager 139, or the sideband channel 157 may include, for example, an address/control (A/C) bus and/or an out-of-band bus (not shown). Status and/or exception information can be provided from the controller 140 on the memory device 101 to a host 110 through, for example, the out-of-band bus and/or address, control and/or commands, e.g., compute commands, may be received by the controller 140, e.g., the RAS manager, via the A/C bus of the sideband channel 157.

In various embodiments, the controller 140 may generate status and/or exception information, which may be transferred to or from host 110, for example, via the sideband channel 157. The sideband channel 157 may be independent of, e.g., separate from, a double data rate (DDR) memory interface, e.g., control bus 154, that may be used to transfer, e.g., pass, DDR commands between the host 110 and the PIM capable device 101 for processing in memory. For example, in some embodiments, the sideband channel 157 may be used to transfer commands to cause performance of bit vector operations, e.g., logical and/or compute operations, from the host 110 to the PIM capable device 101 for processing in memory while the control bus 154 may be used to transfer DRAM commands from the host 110 to the PIM capable device 101 for processing in memory of data read, data write, and/or data erase operations. In some embodiments, the DRAM commands that are transferred via the control bus 154 may be commands to control operation of DRAM, such as DDR1 SDRAM, DDR2 SDRAM, DDR3 SDRAM, and/or DDR4 SDRAM.

The timing circuitry 133 may issue to the RAS manager 139, via the sideband channel 157, instructions, e.g., microcode instructions as described herein, to control timing of performance of a compute operation, where, as shown in FIG. 1A, the sideband channel 157 is separate from the DDR channel data/address bus 156 used to control read and write DRAM access requests for the array 130. Communication through the sideband channel 157 may, in some embodiments, use DDR signaling, although embodiments are not so limited. Using the separate sideband channel 157 and DDR channel data/address bus 156 may enable a bandwidth reduction for the sideband channel 157 and/or the DDR channel data/address bus 156.

As shown in the example of FIG. 1A, the PIM capable device 101, e.g., representing one or more banks, may include components such as a controller 140, a RAS manager 139, a RAS component 136, sensing circuitry 150, and/or a memory array 130, e.g., representing one or more arrays and/or subarrays of memory cells. In some embodiments, the host 110 may include components such as control logic 131, sequencer 132, timing circuitry 133, and/or channel controller 143.

A computing system 100, as described herein, may include a host 110. The host 110 may, in a number of embodiments, include control logic 131. The control logic 131 may be configured to issue a command instruction set, associated with bit vector operations, to a sequencer 132 configured to coordinate compute operations associated with the bit vector operations to initiate performance of a plurality of compute operations. The sequencer 132 may be further configured to issue a command instruction set, associated with the bit vector operations, to timing circuitry 133 configured to provide timing to coordinate the performance of the logical operations. The timing circuitry 133 may be further configured to issue a command instruction set, associated with the bit vector operations, to a RAS manager 139 on a PIM capable device 101. The RAS manager 139 may be configured to coordinate timing of a sequence of compute sub-operations associated with the bit vector operation.

In a number of embodiments, the PIM capable device 101 may further include a RAS component 136 configured to direct performance of the sequence of compute sub-operations by performance of a sequence of bit vector operations, the timing of which is directed by the RAS manager 139. The PIM capable device 101 may further include sensing circuitry 150, including a sense amplifier 206 and a compute component 231, configured to perform the sequence of bit vector operations, as directed by the RAS component 136, the sensing circuitry 150 being selectably coupled to a sense line 205 of an array 130 of memory cells.

In a number of embodiments, the computing system 100 may further include a sideband channel 157 to selectably couple the timing circuitry 133 on the host 110 to the RAS manager 139 on the PIM capable device 101. The sideband channel 157 may be configured as a bidirectional interface for direct communication between the PIM capable device 101 and the host 110 concerning performance of the sequence of compute sub-operations. The sideband channel 157 may be a bus interface for bus protocol instructions sent from the timing circuitry 133 to the RAS manager 139. The bus protocol instructions may, in a number of embodiments, include instructions for primitive logical operations to be performed by the RAS component 136 and the sensing circuitry 150, information to indicate a length of and source row addresses for retrieval of bit vectors by the RAS component 136 to the sensing circuitry 150 for performance of the primitive logical operations, and/or information to indicate a length of and destination row addresses for transfer of data values by the RAS component 136 from the sensing circuitry 150 after performance of the primitive logical operations thereon. In some embodiments, a bandwidth for the sideband channel 157 may be 15,000,000 bits (15 megabits) per second.

A computing system 100, as described herein, may include a host 110 selectably coupled to a device, e.g., the PIM capable device 101 among other possible devices. The host 110 may include a sequencer 132 configured to decode a command for a flow of operations into a sequence of instructions for performance of a sequence of primitives, as described herein. The command for the flow of operations may be a microcode command provided to the sequencer 132 by control logic 131 on the host 110. In a number of embodiments, timing instructions for the sequence of primitives may be provided by the host 110, e.g., by timing circuitry located on the host, to the device for performance of the sequence of primitives.

In some embodiments, the host 110 may use virtual addressing while the PIM capable device 101 for processing in memory may use physical addressing. In order to perform PIM operations on the PIM capable device 101, e.g., in order to perform bit vector operations, the virtual addresses used by the host 110 may be translated into corresponding physical addresses, which may be used by the PIM capable device 101 for processing in memory. In some embodiments, control logic 131 and/or a memory management unit (MMU) controller 134 may perform address resolution to translate the virtual addresses used by the host 110 into the respective physical addresses used by the PIM capable device 101. In some embodiments, the control logic 131 and/or the MMU controller 134 may perform virtual address resolution for PIM operations prior to providing a number of corresponding bit vector operations to the PIM capable device 101 via the sideband channel 157.

The host 110 may include various components including PIM control components (e.g., control logic 131, a sequencer 132, timing circuitry 133), a channel controller 143, and/or a MMU controller 134. The control logic 131 may be configured to execute control flow commands associated with an executing PIM program and to provide composite commands to the sequencer 132. The control logic 131 may be, or may include, a RISC type controller configured to generate and issue an extensible set of composite operation PIM commands that includes commands, different from DDR commands to the sequencer 132. In some embodiments, the control logic 131 may be configured to issue composite operation commands to cause bit vector operations to be performed on the PIM capable device 101. In some embodiments, the composite operation commands may be transferred from the control logic 131 to the PIM capable device 101 for processing in memory (e.g., via sequencer 132, timing circuitry 133, and sideband channel 157). As shown in FIG. 1A, the host 110 (and control logic 131, sequencer 132, timing circuitry 13, and/or MMU controller 134) may be located physically separate from the PIM capable device 101 and/or the array 130.

The control logic 131 may, in some embodiments, decode microcode instructions into function calls, which may be microcode function calls, associated with performing a bit vector operation, implemented by the sequencer 132. The microcode function calls can be the operations that the sequencer 132 receives and/or executes to cause the PIM capable device 101 to perform particular bit vector operations using the sensing circuitry, such as sensing circuitry 150.

As shown in FIG. 1A, the control logic 131 and the MMU controller 134 are located on the host 110, which may allow for the control logic 131 and/or the MMU controller 134 to access virtual addresses stored on the host 110 and perform virtual to physical address resolution on the physical addresses stored on the host 110 prior to transferring instructions to the PIM capable device 101 for processing in memory.

The system 100 may, in some embodiments, include separate integrated circuits such that the components of the memory device 101 and the components of the host 110 may be formed on separate chips. In some embodiments, the components of the memory device 101 and the components of the host 110 may both be formed on the same integrated circuit, as with a system on a chip (SoC). The system 100 can be, for example, a server system and/or a high performance computing (HPC) system and/or a portion thereof.

Figure 1B:
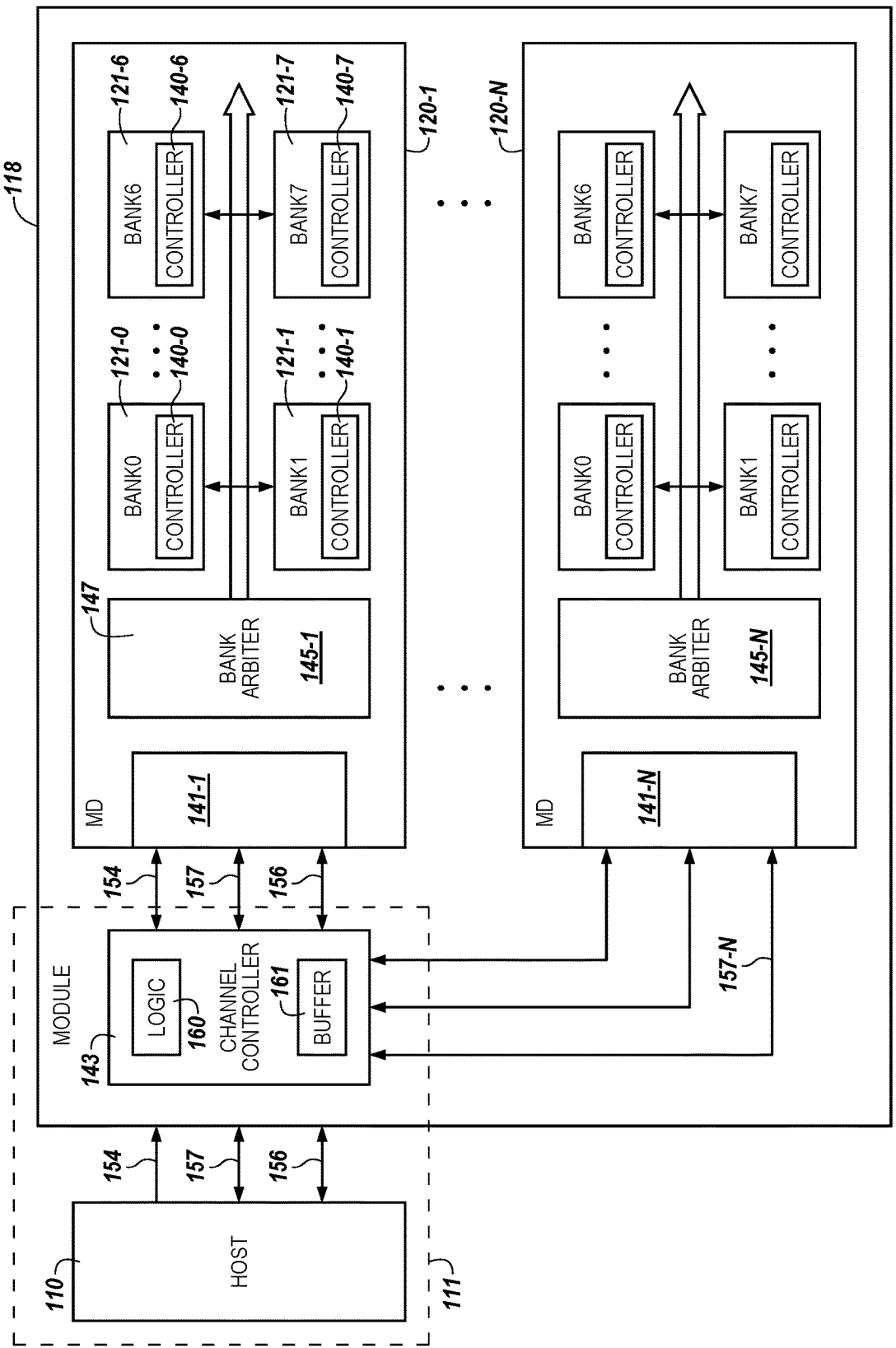
FIG. 1B is another block diagram of an apparatus in the form of a computing system including a memory device in accordance with a number of embodiments of the present disclosure.

FIG. 1B is another block diagram of an apparatus in the form of a computing system including a memory device in accordance with a number of embodiments of the present disclosure. The PIM capable device 101 shown in FIG. 1A may represent one memory device 120 of a plurality of memory devices and/or one bank 121 of a plurality of banks shown and described in connection with FIG. 1B.

The sideband channel 157, e.g., as shown in FIG. 1B, of a bank may be selectably coupled to a bank arbiter, e.g., as shown at 145 in FIG. 1B, to enable communication between the host 110 and the bank of the PIM capable device 101. The bank arbiter 145 may be selectably coupled to the plurality of banks, including associated arrays 130. For example, the timing circuitry 133 of the host 110 may be selectably coupled to the bank arbiter 145 and the bank arbiter 145 may be selectably coupled to the plurality of banks, where each respective bank includes a memory device 101 having an array 130 of memory cells. Each bank of the plurality of banks may include a RAS manager 139 configured to coordinate timing of a sequence of compute sub-operations, associated with the bit vector operation, performed using a RAS component 136 associated with the array 130. Each bank of the plurality of banks may, in some embodiments, be configured to execute a memory array access request, e.g., issued by the host 110 via DDR channel data/address bus 156, and/or each bank of the plurality of banks may include the RAS manager 139 configured to execute the microcode instructions to control timing of performance of a compute operation associated with the bit vector operation.

For clarity, the system 100 shown in FIG. 1A has been simplified to focus on features with relevance to the present disclosure. For example, the memory array 130 can be a DRAM array, SRAM array, STT RAM array, PCRAM array, TRAM array, RRAM array, NAND flash array, and/or NOR flash array. The array 130 can include memory cells arranged in rows coupled by access lines (which may be referred to herein as word lines or select lines) and columns coupled by sense lines, which may be referred to herein as data lines or digit lines, as described further in connection with FIGS. 2 and 3. Although a single array 130 is shown in FIG. 1A, embodiments are not so limited. For example, memory component 101 may include a number of arrays 130, e.g., a number of banks, arrays, and/or subarrays of DRAM cells, NAND flash cells, etc.

The memory device 101 includes address circuitry 142 to latch address signals provided over a data/address bus 156, e.g., an I/O bus used as a DDR channel, through I/O circuitry 144. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page, e.g., row, of data from the memory array 130. The I/O circuitry 144 can be used for bidirectional data communication with host 110 over the data/address bus 156. The write circuitry 148 can be used to write data to the memory array 130. In some embodiments, control bus 154 may serve as both a control and address bus for DRAM control and addressing, e.g., in accordance with a DDR protocol in which control bus 154 operates as a unidirectional data bus. Although shown as separate buses in FIGS. 1A and 1B, control bus 154 and data/address bus 156 may not be separate buses in some embodiments.

In various embodiments, controller 140 may decode signals received via the control bus 154 and/or the data/address bus 156 from the host 110. These signals can include chip enable signals, write enable signals, and address latch signals that are used to control operations performed on the memory array 130, including data read, data write, and/or data erase operations. In one or more embodiments, portions of the controller 140, e.g., RAS manager 139, can be a reduced instruction set computer (RISC) type controller operating on 32 and/or 64 bit length instructions. In various embodiments, the RAS manager 139 is responsible for executing instructions from the host 110, e.g., received from the timing circuitry 133 thereof, in association with the sensing circuitry 150 to perform logical Boolean operations such as AND, OR, XOR, etc. Further, the RAS manager 139 can control shifting data, e.g., right or left, in memory array 130, among other sub-operations performed using the RAS component 136 in a compute operation.

Examples of the sensing circuitry 150 and its operations are described further below in connection with FIGS. 2-4. In various embodiments, the sensing circuitry 150 can include a plurality of sense amplifiers and a plurality of compute components, which may serve as and be referred to as an accumulator, and can be used to perform logical operations, e.g., on data associated with complementary data lines. In some embodiments, a compute component may be coupled to each sense amplifier, e.g., as shown at 231 and 206, respectively, in FIG. 2, within the sensing circuitry 150. However, embodiments are not so limited. For example, in some embodiments, there may not be a 1:1 correlation between the number of sense amplifiers and compute components, e.g., there may be more than one sense amplifier per compute component or more than one compute component per sense amplifier, which may vary between subarrays, banks, etc.

In various embodiments, the sensing circuitry 150 can be used to perform logical operations using data stored in array 130 as inputs and store the results of the logical operations back to the array 130 without transferring data via a sense line address access, e.g., without firing a column decode signal. As such, various compute functions can be performed using, and within, sensing circuitry 150 rather than (or in association with) being performed by processing resources external to the sensing circuitry, e.g., by a processing resource associated with host 110 and/or other processing circuitry, such as ALU circuitry, located on memory device 101, e.g., on controller 140 or elsewhere.

In various previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines.

In contrast, in a number of embodiments of the present disclosure, sensing circuitry 150 is configured to perform logical operations on data stored in memory array 130 and store the result back to the memory array 130 without enabling an I/O line, e.g., a local I/O line, coupled to the sensing circuitry 150. The sensing circuitry 150 can be formed on pitch, e.g., as described in connection with FIG. 2, with the memory cells of the array 130. Additional peripheral sense amplifiers, extended row address (XRA) registers, cache and/or data buffering, e.g., additional logic circuitry, can be coupled to the sensing circuitry 150 and can be used to store, e.g., cache and/or buffer, results of operations described herein.

Thus, in various embodiments, circuitry external to array 130 and sensing circuitry 150 is not needed to perform compute functions because the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

In a number of embodiments, the sensing circuitry 150 may be used to perform logical operations, e.g., to execute instructions, in addition to logical operations performed by an external processing resource, e.g., on host 110. For instance, processing resources on host 110 and/or sensing circuitry 150 on memory device 101 may be limited to performing only certain logical operations and/or a certain number of logical operations.

Enabling an I/O line can include enabling, e.g., turning on, a transistor having a gate coupled to a decode signal, e.g., a column decode signal, and a source/drain coupled to the I/O line. However, embodiments are not limited to not enabling an I/O line. For example, in a number of embodiments, the sensing circuitry, e.g., 150, can be used to perform logical operations without enabling column decode lines of the array; however, the local I/O line(s) may be enabled in order to transfer a result to a suitable location other than back to the array 130, e.g., to an external register.

As shown and described in connection with FIG. 1A, the host 110 may include the timing circuitry 133 that may be selectably coupled to the RAS manager 139 on the memory device 101 to control the timing of performance of a compute operation, associated with a bit vector operation, using the sensing circuitry 150. The host 110 may, in various embodiments, further include control logic 131 configured to issue a command instruction set, associated with the bit vector operation, to a sequencer 132 to initiate a compute operation performed in-memory using the sensing circuitry 150 of the array 130. The control logic 131 may be, or may include, a RISC type controller configured to generate and issue an extensible set of compute commands that includes commands, different from DDR commands to the DDR channel data/address bus 156, to direct performance of the plurality of compute operations. In some embodiments, the control logic 131 may be configured to issue a command instruction set to cause the respective compute operations to be performed on a plurality of memory devices 101, e.g., via bank arbiter 145 to a plurality of banks and/or a plurality of arrays or subarrays in each bank.

As described herein, coded machine instructions can be, for example, microcode instructions. In some embodiments, the control logic 131 may be responsible for fetching coded machine instructions, e.g., the microcode instructions, from an array 130 of memory cells, e.g., a DRAM array, as a DRAM operation. For example, the control logic 131 can fetch machine instructions, which when executed direct performance of compute operations using the sensing circuitry 150 on pitch with the sense lines of array 130.

Operations performed based on execution of the machine instructions can, as described herein, include timing of compute operations, e.g., sequences of Boolean logical operations and/or data movement operations, among others, relative to pending DRAM and/or compute operations. The control logic 131 may be in the form of a microcoded engine that can execute microcode instructions. As used herein, an engine is intended to mean hardware and/or software, but at least hardware in the form of transistor circuitry and/or an application specific integrated circuit (ASIC). In some embodiments, the sequencer 132 also may be in the form of a microcoded engine.

The control logic 131 may, in some embodiments, decode microcode instructions into function calls, which may be microcode function calls, associated with the bit vector operation, implemented by the sequencer 132. The microcode function calls can be the operations that the sequencer 132 receives and/or executes to cause the memory device 101 to perform particular logical operations using the sensing circuitry, such as sensing circuitry 150 in FIG. 1A. The timing circuitry 133 may provide timing to coordinate performance of the logical operations and be responsible for providing conflict free access to the arrays, such as array 130 in FIG. 1A. In various embodiments, the controller 140 and/or the RAS manager 139 may generate status information, which may be routed back to the bank arbiter 145, e.g., via a FIFO interface. The bank arbiter 145 may aggregate this status data and report it back to the host 110, e.g., via the sideband channel 157.

In some embodiments, the sequencer 132 may include a very large instruction word (VLIW) type controller configured to operate on compute commands and the control logic 131 may be configured to issue the compute commands to the sequencer 132 in response to a signal from a processing resource of the host 110. The control logic 131 may, in some embodiments, be configured to generate a VLIW as the command instruction set. The VLIW may be, or may include, microcode instructions. The sequencer 132 may be, or may include, the VLIW type controller configured to decode the VLIW into a plurality of separate microcode instructions. The sequencer 132 may be selectably coupled to the timing circuitry 133 to coordinate compute operations. The plurality of microcode instructions may be executable in sequence and/or in parallel by the sequencer 132 itself and/or by other components in the host 110 downstream from the sequencer 132, e.g., the timing circuitry 133, and/or components in the memory device 101, e.g., the RAS manager 139, the RAS component 136, and/or the sensing circuitry 150.

The controller 140 described in connection with FIG. 1A may be coupled to sensing circuitry 150 and/or additional logic circuitry (not shown), including cache, buffers, sense amplifiers, extended row address (XRA) latches, and/or registers, associated with arrays of memory cells via control lines and data paths. As such, the sensing circuitry 150 shown in FIG. 1A can be associated with the arrays of memory cells 130 using DDR channel data/address bus 156. The controllers 140 may control regular DRAM operations for the arrays such as a read, write, copy, and/or erase operations, etc. Additionally, however, microcode instructions retrieved and/or executed by the control logic 131 and the microcode function calls received and/or executed by the sequencer 132 may cause the sensing circuitry 150 to perform additional logical operations such as shift, addition, multiplication, and division, etc., or, as a more specific example, Boolean operations such as an AND, OR, XOR, etc., which are more complex than regular DRAM read and write operations.

As such, the control logic 131, sequencer 132, and/or timing circuitry 133 may operate to generate sequences of operation cycles for the memory device 101, e.g., a DRAM array therein, associated with a number of bit vector operations. In the PIM capable device 101 example, each sequence may be designed to perform a plurality of operations, such as a Boolean logic operations AND, OR, XOR, etc., which together achieve a specific function. For example, the sequences of operations may repetitively perform a logical operation for a one (1) bit add in order to calculate a multiple bit sum. Each sequence of operations may be fed into a FIFO buffer coupled to the timing circuitry 133 to provide timing coordination with the sensing circuitry 150 associated with the array 130 of memory cells.

FIG. 1B is a block diagram of another apparatus architecture including a plurality of memory devices 120-1, ..., 120-N coupled to a host 110 via a channel controller, e.g., channel controller shown at 143 and described in connection with FIG. 1A. In at least one embodiment, the channel controller 143 may be coupled to the plurality of memory devices 120-1, ..., 120-N in an integrated manner in the form of a module 118, e.g., formed on same chip with the plurality of memory devices 120-1, ..., 120-N. In an alternative embodiment, the channel controller 143 may be integrated with the host 110, as illustrated by dashed lines 111, e.g., formed on a separate chip from, or on a same chip as, e.g., as a SoC, the plurality of memory devices 120-1, ..., 120-N. The channel controller 143 can be coupled to each of the plurality of memory devices 120-1, ..., 120-N via A/C bus 154, as described in FIG. 1A, which in turn can be coupled to the host 110.

The channel controller 143 can also be coupled to each of the plurality of memory devices, 120-1, ..., 120-N via a data/address bus 156, as described in FIG. 1A, which in turn can be coupled to the host 110. In addition, the channel controller 143 can be coupled to each of the plurality of memory devices 120-1, ..., 120-N, for example, via bus associated with a channel interface 141. As used herein, the term channel controller is intended to mean logic in the form of firmware, e.g., microcode instructions, and/or hardware, e.g., an ASIC, to implement one or more particular functions. One example of a channel controller may include a state machine. Another example may include an embedded processing resource. The channel controller 143 includes logic to handle I/O tasks to a device.

As shown in FIG. 1B, the channel controller 143 can receive the status and exception information from the channel interface 141, e.g., also referred to herein as a status channel interface, associated with a bank arbiter 145 in each of the plurality of memory devices 120-1, ..., 120-N. In the example of FIG. 1B, each of the plurality of memory devices 120-1, ..., 120-N can include a respective bank arbiter 145-1, ..., 145-N to sequence control and data with a plurality of banks, e.g., banks 121-0, ..., 121-7, etc., in each of the plurality of memory devices 120-1, ..., 120-N. Each of the plurality of banks, e.g., 121-0, ..., 121-7, can include a controller 140 and other components, including an array of memory cells 130, sensing circuitry 150, logic circuitry, etc., as described in connection with FIG. 1A.

For example, each of the plurality of banks, e.g., 121-0, ..., 121-7, in the plurality of memory devices 120-1, ..., 120-N can include address circuitry 142 to latch address signals provided over a data/address bus 156 (e.g., an I/O bus) through I/O circuitry 144. Status and/or exception information can be provided from the controller 140 on the memory device 120 to the channel controller 143, using the sideband channel 157, which in turn can be provided from the plurality of memory devices 120-1, ..., 120-N to the host 110 and vice versa.

For each of the plurality of banks, e.g., 121-0, ..., 121-7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page, e.g., row, of data from the memory array 130. The I/O circuitry 144 can be used for bidirectional data communication with host 110 over the data/address bus 156. The write circuitry 148 can be used to write data to the memory array 130 and the sideband channel 157 can be used to report status, exception and other data information to the channel controller 143.

The channel controller 143 can include one or more local buffers 161 to store microcode instructions and can include logic 160 to allocate a plurality of locations, e.g., subarrays or portions of subarrays, in the arrays of each respective bank to store microcode instructions, e.g., bank commands and arguments, compute commands associated with bit vector operations, etc., for the various banks associated with the operation of each of the plurality of memory devices 120-1, ..., 120-N. The channel controller 143 can send microcode instructions, e.g., bank commands and arguments, PIM commands, status and exception information, etc., to the plurality of memory devices 120-1, ..., 120-N to store those microcode instructions within a given bank of a memory device. For example, the channel controller 143 and/or bank arbiter 145 may send, e.g., as received from host 110, instructions associated with bit vector operations, e.g., via channel interfaces 141-1, ..., 141-N, the respective plurality of banks 121-1, ..., 121-7 in each of the respective plurality of memory devices 120-1, ..., 120-N.

Figure 2:
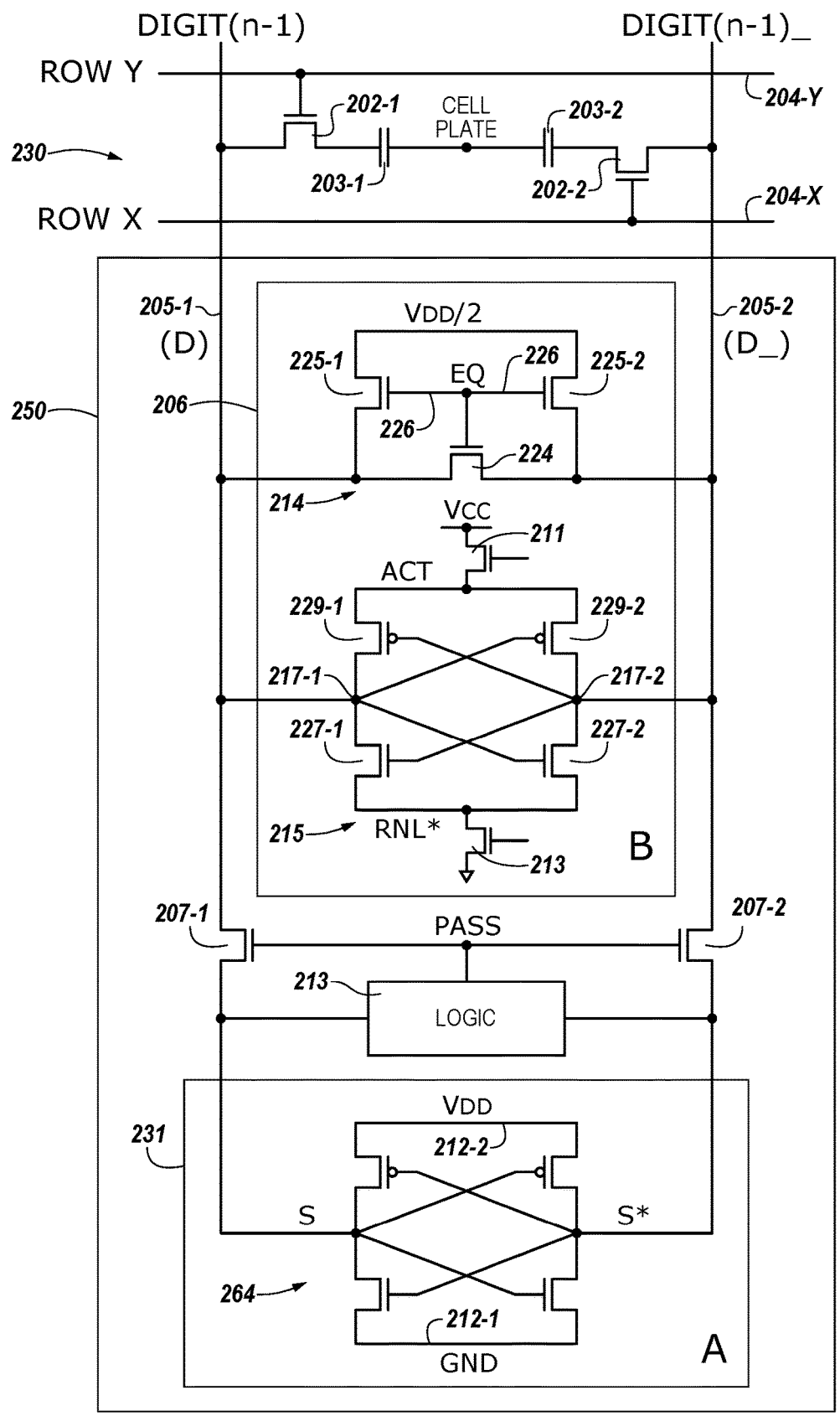
FIG. 2 is a schematic diagram illustrating sensing circuitry of a memory device in accordance with a number of embodiments of the present disclosure.

FIG. 2 is a schematic diagram illustrating sensing circuitry 250 in accordance with a number of embodiments of the present disclosure. The sensing circuitry 250 can represent the sensing circuitry 150 shown in FIG. 1A. In FIG. 2, a memory cell includes a storage element, e.g., capacitor, and an access device, e.g., transistor. For example, a first memory cell includes transistor 202-1 and capacitor 203-1, and a second memory cell includes transistor 202-2 and capacitor 203-2, etc. In this example, the memory array 230 is a DRAM array of 1T1C (one transistor one capacitor) memory cells. In a number of embodiments, the memory cells may be destructive read memory cells, e.g., reading the data stored in the cell destroys the data such that the data originally stored in the cell is refreshed after being read.

The cells of the memory array 230 can be arranged in rows coupled by word lines 204-X (Row X), 204-Y (Row Y), etc., and columns coupled by pairs of complementary sense lines, e.g., data lines DIGIT(n−1)/DIGIT(n−1)_, DIGIT(n)/DIGIT(n)_, DIGIT(n+1)/DIGIT(n+1)_. The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines, e.g., 4,096, 8,192, 16,384 data lines, etc.

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage, e.g., ground, can be applied in various memory array configurations.

The memory array 230 is coupled to sensing circuitry 250 in accordance with a number of embodiments of the present disclosure. In this example, the sensing circuitry 250 includes a sense amplifier 206 and a compute component 231 corresponding to respective columns of memory cells, e.g., coupled to respective pairs of complementary data lines. The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

In previous approaches, data may be transferred from a memory array and sensing circuitry, e.g., via a bus including I/O lines, to a processing resource such as a processor, microprocessor, and/or compute engine, which may include ALU circuitry and/or other functional unit circuitry configured to perform the appropriate operations. However, transferring data from the memory array and sensing circuitry to such processing resource(s) can involve significant time and/or power consumption. Even if the processing resource is located on a same chip as the memory array, significant power can be consumed in moving data out of the array to the compute circuitry, which can involve performing a sense line (which may be referred to herein as a digit line or data line) address access, e.g., firing of a column decode signal, in order to transfer data from sense lines onto I/O lines, e.g., local I/O lines, transferring the data peripheral to the array, which may be transferred to a cache in a host, and providing the data to the peripheral compute circuitry.

Furthermore, the circuitry of the processing resource(s), e.g., a compute engine, may not conform to pitch rules associated with a memory array. For example, the memory cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which can affect chip size and/or memory density, for example. In the context of some computing systems and subsystems, e.g., a central processing unit (CPU), data may be processed in a location that is not on pitch and/or on chip with memory, e.g., memory cells in the array, as described herein. The data may be processed by a processing resource associated with a host, for instance, rather than on pitch with the memory.

In contrast, a number of embodiments of the present disclosure can include the control circuitry and/or the sensing circuitry, e.g., including sense amplifiers and/or compute components, as described herein, being formed on pitch with the memory cells of the array and being configured to, e.g., being capable of performing, compute functions, e.g., operations, such as those described herein, on pitch with the memory cells. The sensing circuitry is capable of performing data sensing and compute functions and at least temporary storage, e.g., caching, of data local to the array of memory cells.

The sensing circuitry 150 described herein can, in some embodiments, be formed on a same pitch as a pair of complementary sense lines. As an example, a pair of complementary memory cells may have a cell size with a $6F^2$ pitch, e.g., 3F×2F. If the pitch of a pair of complementary sense lines for the complementary memory cells is 3F, then the sensing circuitry being on pitch indicates the sensing circuitry, e.g., a sense amplifier and corresponding compute component per respective pair of complementary sense lines, is formed to fit within the 3F pitch of the complementary sense lines.

A number of embodiments of the present disclosure can include the sensing circuitry 150, e.g., including sense amplifiers and/or compute components, being formed on pitch with the memory cells of the array. The sensing circuitry 150 can be configured for, e.g., capable of, performing compute functions, e.g., logical operations.

The logical operation selection logic 213 can be configured to include pass gate logic for controlling pass gates that couple the pair of complementary sense lines un-transposed between the sense amplifier 206 and the compute component 231 and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 213.

The sense amplifier 206 can be operated to determine a data value, e.g., logic state, stored in a selected memory cell. The sense amplifier 206 can include a cross coupled latch, which can be referred to herein as a primary latch. In the example illustrated in FIG. 2, the circuitry corresponding to sense amplifier 206 includes a latch 215 including four transistors coupled to a pair of complementary data lines D 205-1 and D_ 205-2. However, embodiments are not limited to this example. The latch 215 can be a cross coupled latch, e.g., gates of a pair of transistors, such as n-channel transistors, e.g., NMOS transistors, 227-1 and 227-2 are cross coupled with the gates of another pair of transistors, such as p-channel transistors, e.g., PMOS transistor 229-1 and 229-2. The cross coupled latch 215 including transistors 227-1, 227-2, 229-1, and 229-2 can be referred to as a primary latch.

In operation, when a memory cell is being sensed, e.g., read, the voltage on one of the data lines 205-1 (D) or 205-2 (D_) will be slightly greater than the voltage on the other one of data lines 205-1 (D) or 205-2 (D_). An ACT signal and the RNL* signal can be driven low to enable, e.g., fire, the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage, e.g., ground, through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier, e.g., sense amplifier coupled to one data line. Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access, e.g., without firing a column decode signal such that data is transferred to circuitry external from the array and sensing circuitry via local I/O lines. As such, a number of embodiments of the present disclosure can enable performing logical operations and compute functions associated therewith using less power than various previous approaches. Additionally, since a number of embodiments eliminate the need to transfer data across I/O lines in order to perform compute functions, e.g., between memory and discrete processor, a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 includes a transistor 224 coupled between data lines 205-1 (D) and 205-2 (D_). The equilibration circuitry 214 also includes transistors 225-1 and 225-2 each having a first source/drain region coupled to an equilibration voltage, e.g., $V_{DD}/2$, where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage, e.g., $V_{DD}/2$.

Although FIG. 2 shows sense amplifier 206 including the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry, e.g., sense amplifier 206 and compute component 231, can be operated to perform a selected logical operation and initially store the result in one of the sense amplifier 206 or the compute component 231 without transferring data from the sensing circuitry via an I/O line, e.g., without performing a data line address access via activation of a column decode signal.

Performance of logical operations, e.g., Boolean logical functions involving data values, is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also include a latch, which can be referred to herein as a secondary latch 264. The secondary latch 264 can be configured and operated in a manner similar to that described above with respect to the primary latch 215, with the exception that the pair of cross coupled p-channel transistors, e.g., PMOS transistors, of the secondary latch can have their respective sources coupled to a supply voltage, e.g., $V_{DD}$, and the pair of cross coupled n-channel transistors, e.g., NMOS transistors, of the secondary latch can have their respective sources selectively coupled to a reference voltage, e.g., ground, such that the secondary latch is continuously enabled. The configuration of the compute component is not limited to that shown in FIG. 2 at 231, and various other embodiments are described further below.

Figure 3:
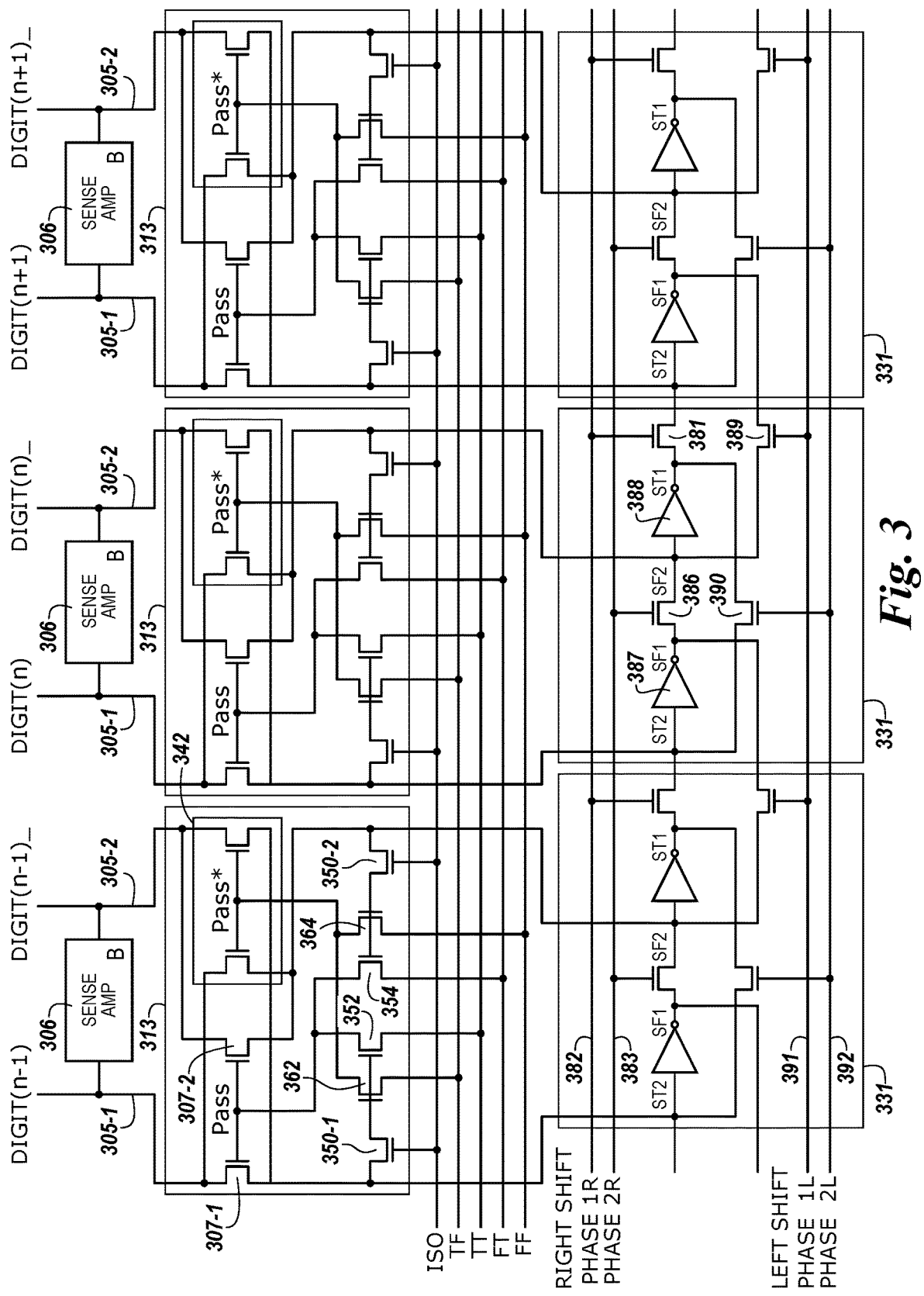
FIG. 3 is another schematic diagram illustrating sensing circuitry of a memory device in accordance with a number of embodiments of the present disclosure.

FIG. 3 is another schematic diagram illustrating sensing circuitry of a memory device in accordance with a number of embodiments of the present disclosure. FIG. 3 illustrates the sensing circuitry as being capable of implementing, for example, logical operations.

FIG. 3 shows a sense amplifier 306 coupled to a pair of complementary sense lines 305-1 and 305-2, logical operation select logic 313, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to the compute component 231 shown in FIG. 2. Sense amplifier 306 and compute component 331 can be included in the sensing circuitry, e.g., as shown at 150 in FIG. 1A and 250 in FIG. 2. The logical operation selection logic 313 shown in FIG. 3 can correspond to logical operation selection logic 213 shown in FIG. 2. The gates of the pass gates 307-1 and 307-2 can be controlled by a logical operation selection logic 313 signal, e.g., Pass. For example, an output of the logical operation selection logic 313 can be coupled to the gates of the pass gates 307-1 and 307-2. Further, the compute component 331 can include a loadable shift register configured to shift data values left and right.

As illustrated in FIG. 3, the compute components 331 can include respective stages, e.g., shift cells, of a loadable shift register configured to shift data values left and right. For example, as illustrated in FIG. 3, each compute component 331, e.g., stage, of the shift register includes a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein.

The sensing circuitry illustrated in FIG. 3 shows operation selection logic 313 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary sense lines 305-1 and 305-2 when isolation transistors 350-1 and 350-2 are enabled via an ISO control signal being asserted.

According to various embodiments, the operation selection logic 313 can include four logic selection transistors: logic selection transistor 362 coupled between the gates of the swap transistors 342 and a TF signal control line; logic selection transistor 352 coupled between the gates of the pass gates 307-1 and 307-2 and a TT signal control line; logic selection transistor 354 coupled between the gates of the pass gates 307-1 and 307-2 and a FT signal control line;

and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can include a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. In this example, the logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A" as shown in FIG. 2) in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. For example, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 306 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic 313 signal Pass can be activated, e.g., high, to OPEN the pass gates 307-1 and 307-2, e.g., conducting, when the ISO control signal line is activated and either the TT control signal is activated, e.g., high, with data value on the true sense line is "1" or the FT control signal is activated, e.g., high, with the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line, e.g., sense line to which the gate of the particular logic selection transistor is coupled, is not high, then the pass gates 307-1 and 307-2 will not be OPENed by a particular logic selection transistor.

The logical operation selection logic signal Pass* can be activated, e.g., high, to OPEN the swap transistors 342, e.g., conducting, when the ISO control signal line is activated and either the TF control signal is activated, e.g., high, with data value on the true sense line is "1," or the FF control signal is activated, e.g., high, with the data value on the complement sense line is "1." If either the respective control signal or the data value on the corresponding sense line, e.g., sense line to which the gate of the particular logic selection transistor is coupled, is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals, e.g., logical operation selection is not dependent on the data value present on the pair of complementary sense lines. Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented using the sensing circuitry illustrated in FIG. 3 can be the logical operations summarized in the logic tables shown in FIG. 4.

FIG. 4 is a logic table illustrating selectable logic operation results implemented using sensing circuitry shown in FIG. 3 in accordance with a number of embodiments of the present disclosure. The four logic selection control signals, e.g., TF, TT, FT, and FF, in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines, controls the continuity of the pass gates 307-1 and 307-2 and swap transistors 342, which in turn affects the data value in the compute component 331 and/or sense amplifier 306 before/after firing. The capability to selectably control continuity of the swap transistors 342 facilitates implementing logical operations involving inverse data values, e.g., inverse operands and/or inverse result, among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals, e.g., TF, TT, FT, and FF, in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented using the sensing circuitry, e.g., 250 in FIG. 2, are summarized in Logic Table 4-2 illustrated in FIG. 4.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

Hence, embodiments described herein provide a method for performing processing in memory, e.g., in-memory, operations, which may be performed utilizing a PIM capable device 101 as described herein. An example of such a method can include receiving microcode timing instructions, e.g., from timing circuitry 133 shown and described in connection with FIG. 1A, for a compute operation, associated with a bit vector operation, at a RAS manager, e.g., as shown at 139 and described in connection with FIG. 1A. The RAS manager 139 may be located on the PIM capable device 101. The timing instructions may be received from a source external to the PIM capable device 101, e.g., from host 110 shown and described in connection with FIG. 1A. The RAS manager 139 may be configured to coordinate timing of a sequence of compute sub-operations, associated with the bit vector operation, on the PIM capable device 101. The method can include using a RAS component, e.g., as shown at 136 and described in connection with FIG. 1A, on the memory device 101, which is coupled to the RAS manager, to perform the sequence of compute sub-operations. The sequence of compute sub-operations may be performed by selecting a specific row of memory cells in an array, retrieving data values from the specific row, and/or inputting data values to the specific row, among other possible sub-operations. The method can include performing the compute operation using sensing circuitry, e.g., as shown at 150 and described in connection with FIG. 1A, on the memory device 101.

In some embodiments, the method may further include using the RAS manager 139 on the PIM capable device 101 to control timing of performance of logical operations, e.g., such as one or more Boolean operations, among other types of logical operations, using the sensing circuitry 150 formed on pitch with sense lines 205 a memory array, e.g., as shown at 130 and described in connection with FIG. 1A. In some embodiments, a sequencer, e.g., as shown at 132 and described in connection with FIG. 1A, associated with the timing circuitry 133 on the source external to the PIM capable device 101 may be used to generate sequences of operation cycles, as described herein, to perform a plurality of compute operations using the sensing circuitry 150 on the PIM capable device 101.

The method may further include using the timing circuitry 133 on the host 110 to execute instructions to coordinate timing of the compute operation, issuing the instructions to the RAS manager 139 on the PIM capable device 101. The RAS manager 139 may be responsible for coordinating timing of the sequence of compute sub-operations and performing the timed sequence of compute sub-operations via the RAS component 136 on the PIM capable device 101. In some embodiments, the method may further include issuing a compute request, addressed to a virtual address, as described herein, from control logic, e.g., as shown at 131 and described in connection with FIG. 1A, on the PIM capable device 101 and receiving the compute request at the sequencer 132 separate from the PIM capable device 101 and coupled to the control logic 131.

The sequencer 132 may, in some embodiments, be used to convert the virtual address of the compute request to a real address corresponding to a particular column and/or row in the array 130. Such a conversion by the host 110 may enable a reduction in use of a processing resource on the PIM capable device 101 by reducing conversion of the virtual address to the real address by the PIM capable device 101. Reduction in use of the processing resources in the PIM capable device 101 may reduce time, energy, and/or cost of such a conversion and/or increase the efficiency of such a conversion by the increased power and/or accessibility of various memory resources in the host 110, e.g., processors, micro-processors, ASICs, CPU, etc., relative to those of the PIM capable device 101. For example, the host 110 may include a scalar processor (not shown) that may be used for comparison of bit vectors and performance of some operations thereon. Alternatively, or in addition to use of the sequencer 132, the scalar processor be used for the conversion of the virtual address to the real address.

Separating control circuitry, such as the control logic 131, the sequencer 132, and/or the timing circuitry 133, from the PIM capable device 101 may provide a number of advantages. For example, such a separation may allow for more freedom in PIM designs in volatile memory devices, e.g., DRAM, in non-volatile memory devices, e.g., SRAM, NAND, etc., in CMOS sensors, and/or in other potential computation media in the PIM capable device 101, while still being able to utilize the separate control circuitry described herein. Separating the control circuitry also may reduce complexity of memory device 101 design because a significant amount of circuitry may be moved to the host 110, where there may be more space for, or options for placement of, such components than in the PIM capable device 101.

While example embodiments including various combinations and configurations of controllers, RAS managers, RAS components, memory arrays, sensing circuitry, control logic, sequencers, and/or timing circuitry have been illustrated and described herein, embodiments of the present disclosure are not limited to those combinations explicitly recited herein. Other combinations and configurations of the controllers, RAS managers, RAS components, memory arrays, sensing circuitry, control logic, sequencers, and/or timing circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
    a memory device configured to perform bit vector operations; and
    a host comprising:
        control logic configured to generate high level instructions associated with the bit vector operations;
        a sequencer configured to decode the high level instructions into a plurality of low level instructions associated with the bit vector operations; and
        timing circuitry configured to control timing, associated with the plurality of low level instructions associated with the bit vector operations, of performance of a compute operation;
        wherein the plurality of low level instructions are executable in parallel by a plurality of compute components downstream from the sequencer.

2. The system of claim 1, wherein the memory device comprises an array of memory cells and the plurality of compute components, and
    wherein the plurality of compute components is selectively coupled to the array of memory cells.

3. The system of claim 2, wherein the plurality of compute components is configured to select a specified row of memory cells in the array as provided by the low level instructions.

4. The system of claim 2, wherein the plurality of compute components is configured to retrieve a data value from a specified row of memory cells in the array as provided by the low level instructions.

5. The system of claim 2, wherein the plurality of compute components is configured to input a data value to a specified row of memory cells in the array as provided by the low level instructions.

6. The system of claim 2, wherein the plurality of compute components is configured to perform a sub-operation of a compute operation as provided by the low level instructions.

7. The system of claim 6, wherein the compute operation is performed on a data value while the data value is stored in sensing circuitry of the memory device.

8. The system of claim 6, wherein the plurality of compute components is configured to perform a sequence of sub-operations that enable the compute operation to be performed as provided by the low level instructions.

9. The system of claim 8, wherein the sequence of sub-operations includes shift operations.

10. A method, comprising:
    generating, using control logic of a host, composite operation commands associated with bit vector operations performed by a memory device coupled to the host;
    decoding, using a sequencer of the host, the composite operation commands into a plurality of low level instructions associated with the bit vector operations;
    controlling, using timing circuitry of the host, timing, associated with the plurality of low level instructions associated with the bit vector operations, of performance of a compute operation; and
    wherein the plurality of low level instructions are executable in parallel by a plurality of compute components, of the memory device, downstream from the sequencer.

11. The method of claim 10, wherein the method further comprises using a row address strobe (RAS) manager on the memory device to control timing of performance of sub-operations using the plurality of compute components of the memory device as provided by the low level instructions.

12. The method of claim 11, wherein the plurality of compute components is coupled to sensing circuitry of the memory device.

13. The method of claim 11, wherein the RAS manager is configured to execute timing instructions received from the timing circuitry for performance of the compute operations.

14. The method of claim 13, wherein the RAS manager is configured to execute the timing instructions and the low level instructions to cause the plurality of compute operations to perform the sub-operations.

15. The method of claim 10, wherein the method further comprises using the sequencer associated with timing circuitry on a source separate from the memory device to generate sequences of operation cycles to perform a plurality of compute operations, associated with the bit vector operations, using sensing circuitry and the plurality of compute components on the memory device.

16. A system, comprising:
    a memory device configured to perform bit vector operations; and
    a host comprising:
        control logic configured to generate high level instructions associated with the bit vector operations;
        a sequencer configured to decode the high level instructions into a plurality of low level instructions associated with the bit vector operations; and
        timing circuitry configured to control timing, associated with the plurality of low level instructions associated with the bit vector operations, of performance of a compute operation;
        wherein the plurality of low level instructions are executable in parallel by a plurality of compute components downstream from the sequencer, wherein the plurality of compute components are coupled to a memory array of the memory device.

17. The system of claim 16, wherein:
    the sequencer is further configured to decode a very large instruction word (VLIW) for a flow of operations of instructions for performance of the bit vector operations; and
    the host is further configured to provide timing instructions for the bit vector operations to the memory device for performance of the bit vector operations.

18. The system of claim 17, wherein performance of the bit vector operations further comprises performing the bit vector operations utilizing at least one of the plurality of compute components of the memory device.

19. The system of claim 16, wherein the host is further configured to receive status information from the memory device regarding the performance of the bit vector operations.

20. The system of claim 16, wherein the sequencer is configured to decode the high level instructions into a sequence of instructions for performance of a sequence of primitives.

* * * * *